(12) United States Patent
Kovtoun et al.

(10) Patent No.: US 9,543,136 B2
(45) Date of Patent: Jan. 10, 2017

(54) ION OPTICS COMPONENTS AND METHOD OF MAKING THE SAME

(71) Applicants: Viatcheslav V. Kovtoun, Santa Clara, CA (US); Andrew W. Schirmer, Campbell, CA (US); Syed F. Rizvi, San Jose, CA (US); Philip M. Remes, Berkeley, CA (US)

(72) Inventors: Viatcheslav V. Kovtoun, Santa Clara, CA (US); Andrew W. Schirmer, Campbell, CA (US); Syed F. Rizvi, San Jose, CA (US); Philip M. Remes, Berkeley, CA (US)

(73) Assignee: Thermo Finnigan LLC, San Jose, CA (US)

( * ) Notice: Subject to any disclaimer, the term of this patent is extended or adjusted under 35 U.S.C. 154(b) by 364 days.

(21) Appl. No.: 13/893,276

(22) Filed: May 13, 2013

(65) Prior Publication Data
US 2014/0332694 A1 Nov. 13, 2014

(51) Int. Cl.
*H01J 49/00* (2006.01)
*H01J 49/06* (2006.01)

(52) U.S. Cl.
CPC ............. *H01J 49/062* (2013.01); *H01J 49/06* (2013.01); *H01J 49/068* (2013.01)

(58) Field of Classification Search
CPC ......... H01J 49/062; H01J 49/068; H01J 49/06
USPC ..................................... 250/396 R, 281, 282
See application file for complete search history.

(56) References Cited

U.S. PATENT DOCUMENTS

| | | | |
|---|---|---|---|
| 4,158,771 A | 6/1979 | Beeck et al. |
| 4,885,470 A | 12/1989 | Abbott |
| 5,389,785 A | 2/1995 | Steiner et al. |
| 5,847,386 A | 12/1998 | Thomson et al. |
| 5,852,302 A | 12/1998 | Hiraishi et al. |
| 6,102,763 A | 8/2000 | Cueni et al. |

(Continued)

FOREIGN PATENT DOCUMENTS

| | | |
|---|---|---|
| CN | 101063672 A | 10/2007 |
| CN | 102214542 A | 10/2011 |

(Continued)

OTHER PUBLICATIONS

Glasmachers et al., "Planar Technologies for Optimized Realisation of Quadrupole IonGuides and Quadrupole Ion WaveGuides," poster, 58th ASMS Conference on Mass Spectrometry, Salt Lake City, UT (2010).

(Continued)

*Primary Examiner* — Michael Maskell
(74) *Attorney, Agent, or Firm* — David A. Schell

(57) ABSTRACT

A method of making an ion optics component includes providing an electrically isolating substrate and machining away material of the substrate from at least one major surface thereof to form features of a first electrode subassembly. The formed features include a first surface for supporting integration of a first electrode body and a second surface for supporting integration of a second electrode body. Subsequent plating and masking steps result in the formation of a first electrode body on the first surface and a second electrode body on the second surface. A bridge is integrally formed in the electrically isolating material, so as to electrically isolate the first electrode body from the second electrode body.

9 Claims, 19 Drawing Sheets

(56) References Cited

U.S. PATENT DOCUMENTS

| | | | |
|---|---|---|---|
| 6,870,158 B1 | 3/2005 | Blain | |
| 6,967,326 B2 | 11/2005 | Pai et al. | |
| 7,012,250 B1* | 3/2006 | Aksyuk | H01J 9/424 |
| | | | 250/281 |
| 7,081,623 B2* | 7/2006 | Pai | B81B 1/100 |
| | | | 216/2 |
| 7,154,088 B1 | 12/2006 | Blain et al. | |
| 7,411,187 B2* | 8/2008 | Monroe | G06N 99/002 |
| | | | 250/207 |
| 7,928,375 B1* | 4/2011 | Mangan | H01J 49/0018 |
| | | | 250/283 |
| 8,481,929 B2* | 7/2013 | Steiner | H01J 49/005 |
| | | | 250/281 |
| 8,618,473 B2* | 12/2013 | Steiner | H01J 49/063 |
| | | | 250/281 |
| 9,111,741 B2* | 8/2015 | Ding | H01J 49/004 |
| 2004/0227071 A1* | 11/2004 | Giles | G01N 27/622 |
| | | | 250/287 |
| 2005/0061767 A1 | 3/2005 | Pai et al. | |
| 2007/0040113 A1 | 2/2007 | Monroe et al. | |
| 2009/0294641 A1 | 12/2009 | Konicek et al. | |
| 2011/0168882 A1* | 7/2011 | Hoyes | H01J 49/062 |
| | | | 250/283 |
| 2013/0015347 A1* | 1/2013 | Steiner | H01J 49/068 |
| | | | 250/288 |

FOREIGN PATENT DOCUMENTS

| | | |
|---|---|---|
| JP | 2006-332003 A | 12/2006 |
| WO | 2006/059123 A2 | 6/2006 |
| WO | 2011/081188 A1 | 7/2011 |
| WO | 2012/163268 A1 | 12/2012 |

OTHER PUBLICATIONS

Glasmachers et al., "Transfer Efficiency and Timing Performance Measurements of Multipole Ion Guides and Ion Wave Guides Constructed with Planar Technologies," poster, 59th ASMS Conference on Mass Spectrometry, Denver, CO (2011).

* cited by examiner

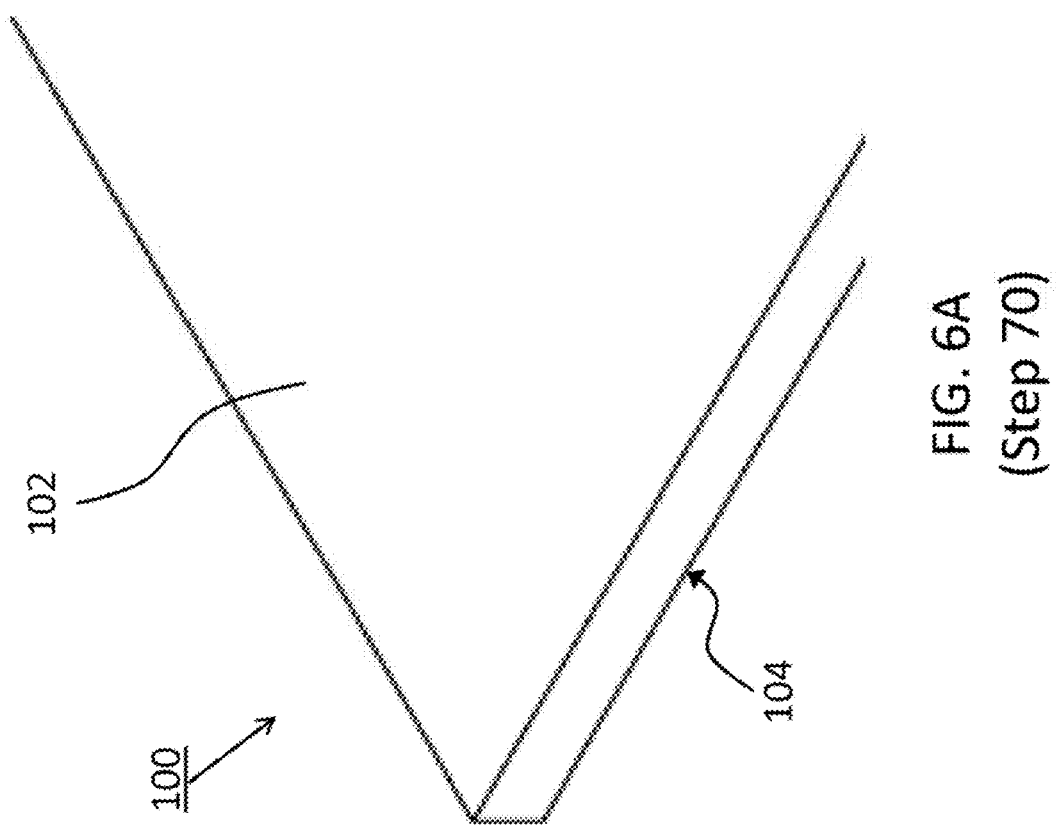

(Step 72)

(Step 74)

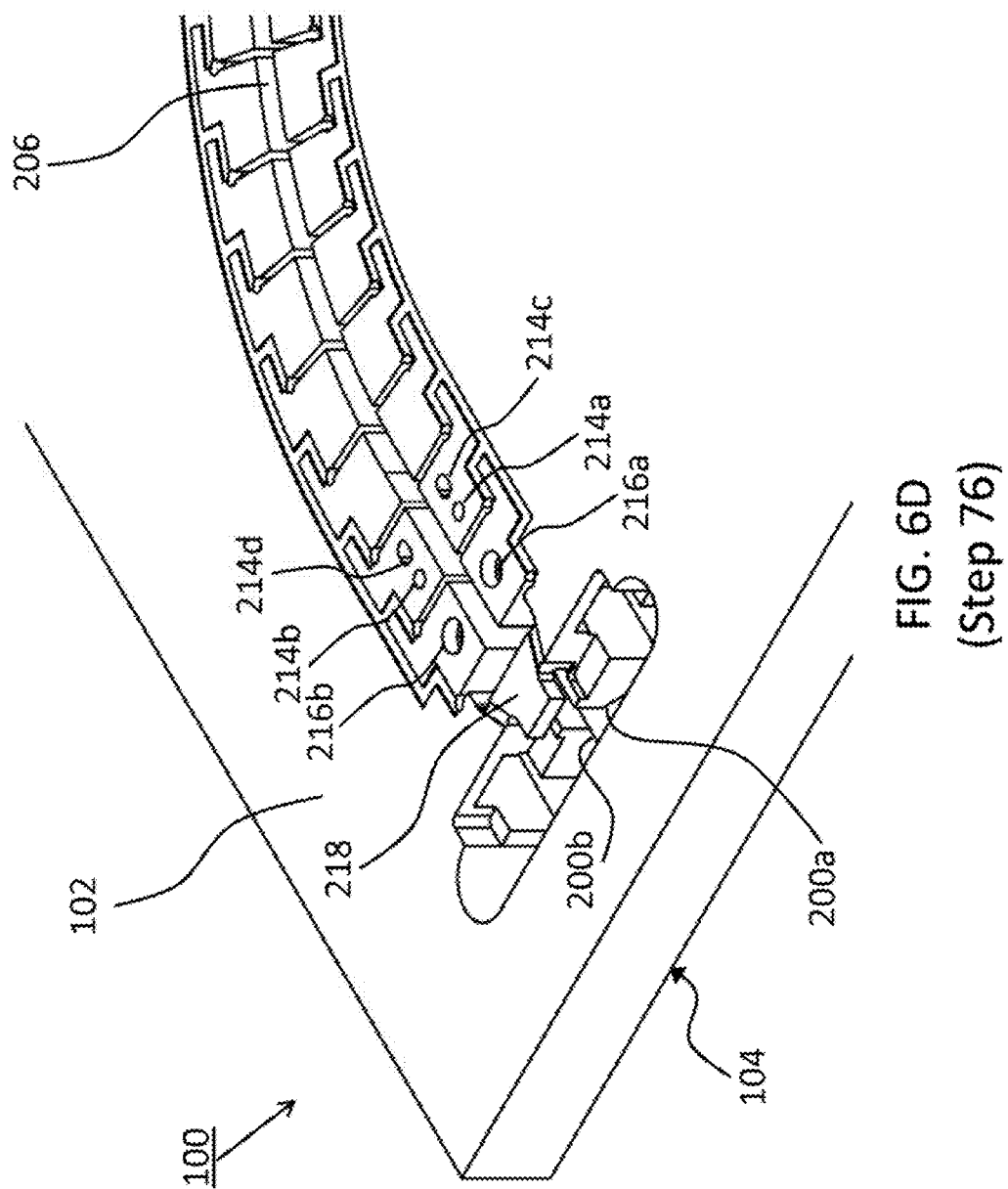
FIG. 6D (Step 76)

(Step 78)

(Step 80)

(Step 82)

ION OPTICS COMPONENTS AND METHOD OF MAKING THE SAME

FIELD OF THE INVENTION

The present invention relates generally to ion optics components, and more particularly to ion optics components based on electrode sub-assemblies that are fabricated using printed circuit board (PCB) technologies.

BACKGROUND OF THE INVENTION

A mass spectrometer (MS) is a device that filters gaseous ions according to their mass-to-charge (m/z) ratio and measures the relative abundance of each ionic species. A typical mass spectrometer comprises an ion source, wherein the ions are generated; a mass filter, wherein the ions are separated in space or in time; an ion detector, wherein the filtered ions are collected and their relative ion abundance measured; a vacuum system; and a power source to power the spectrometer. Depending on the type of sample and the method of introducing the sample into the mass spectrometer, ions can be generated in the ion source by electron impact ionization, photoionization, thermal ionization, chemical ionization, desorption ionization, spray ionization, or other processes.

Mass spectrometers are generally classified according to the basis on which the mass filtering is accomplished using electric and/or magnetic fields. Mass filter types include magnetic-sector, time-of-flight, linear quadrupole, ion cyclotron resonance, and ion traps. Detection of ions is typically accomplished using a single-point ion collector, such as a Faraday cup or an electron multiplier, or using a multipoint collector, such as an array or a microchannel plate collector, whereby all of the ions arrive at the collector simultaneously.

Conventional mass spectrometers use metallic components that are fabricated using standard metal machining techniques. The metallic components cause such mass spectrometers to be large and bulky, which limits the widespread application and deployment of such devices. Further, the metallic components are expensive to manufacture and assemble together. With reference to FIG. 1, shown is a simplified diagram of a quadrupole assembly 2 of rod-shaped electrodes 4. Each electrode 4 is a metallic rod of circular cross-section. The four rods are arranged precisely one relative to another in two electrode pairs aligned with and opposed across the device centerline. An ion volume 6 is defined between the electrodes 4, within which volume the ions are transmitted along the z-direction either with or without mass filtering, depending on the particular voltages that are applied to the electrodes 4.

FIG. 2 shows an assembly 8 including a plurality of segmented electrodes 10. Assembly 8 is similar to the assembly 2, but each electrode 10 comprises a plurality of individual segments 18, which are electrically isolated one from another. Application of appropriate voltages to the individual segments 18 creates a voltage gradient that is directed along the axial direction (z-direction) within the ion volume 12. The axially directed voltage gradient is used to move ions along the length of the assembly 8.

Electrode assemblies 2 and 8 may be used as ion guides for transferring ions between different stages of a mass spectrometer. Of course, in addition to the quadrupole configurations that are shown in FIGS. 1 and 2, ion guides comprising six electrodes (hexapole) or eight electrodes (octapole) are also known. Further, ion guides having stacked-ring electrode geometries have been described previously, such as for instance ion funnels and ring pole ion guides. All of the above-mentioned types of ion guides must be assembled together, requiring precise alignment of the various electrodes and other components. As a person of skill in the art will undoubtedly appreciate, assembling together the separate pieces of an ion guide is a labor intensive and time consuming process. Further, it is necessary to make electrical connections to each of the individual electrodes in the assembled ion guide structures, which is prone to error and results in complex assemblies.

Considerable effort has been devoted to developing miniature mass spectrometers, particularly for use in field applications including forensics, food and environmental analysis, clinical lab analysis, etc. Such applications require analytical instruments that feature high reliability, robustness, high performance and low cost. Of course, it goes without saying that mass spectrometers based on metallic components fabricated using standard metal machining techniques are not well suited to miniaturization. In particular, miniaturization exacerbates the difficulty of machining components using standard metal machining techniques and subsequently assembling together the individual components.

In U.S. Pat. No. 6,967,326, Pai et al. disclose miniature mass spectrometers comprising multi-layer structures deposited on semiconductor or dielectric wafer-substrates, based on microelectronics processing techniques. Pai et al. teach that the multi-layer structures are built up in multiple vapor-deposition or sputtering steps. Sacrificial materials are used to preserve the structures that are formed in previous steps, necessitating a step with a chemical etchant to remove the sacrificial material and create open structures. The process of forming the miniature mass spectrometers therefore involves numerous steps and the use of potentially hazardous chemicals. Further, since the deposition steps produce planar features that are stacked one on top of another, the types of electrode geometries that can be fabricated using the method that is described by Pai et al. is quite limited. For instance, structures that approximate the rod-shaped electrodes of a quadrupole ion guide cannot readily be fabricated using the technique that is disclosed by Pai et al.

Glasmachers et al. ("Transfer Efficiency and Timing Performance Measurements of Multipole Ion Guides and Ion Wave Guides Constructed with Planar Technologies, Poster Presentation No. ThP 063, 59$^{th}$ ASMS Conference on Mass Spectrometry and Allied Topics (2011)) have disclosed multipole ion guides and ion wave-guides that are constructed using standard high precision technologies for printed circuit boards. A quadrupole ion wave-guide with segmented electrodes is described, in which each of the segmented electrodes is fabricated using PCBs with gold plating to define the electrode segments and electrical connections, etc. Unfortunately, all of the electrode segments are defined along one edge of a substrate, which is pre-cut to a desired shape. As such, each segmented electrode must be fabricated separately and then aligned with three other segmented electrodes during assembly of the quadrupole ion wave-guide. The need to precisely align four segmented electrode structures, in the case of a quadrupole device, complicates assembly and is time consuming. Further, the method that is described by Glasmachers et al. is not well suited for fabricating devices with curved ion transport pathways, etc.

It would therefore be beneficial to provide an ion optics component and a method of making ion optics components, which overcome at least some of the above-mentioned disadvantages.

SUMMARY OF THE INVENTION

In accordance with an aspect of at least one embodiment of the instant invention, there is provided a method of making an ion optics component, comprising: providing an electrically isolating substrate having a first major surface and a second major surface, the second major surface opposite and substantially parallel to the first major surface; machining away material of the substrate from the first major surface to form features of a first electrode sub-assembly comprising a first surface for supporting integration of a first electrode body and a second surface for supporting integration of a second electrode body; and plating and masking the first surface and the second surface of the first electrode sub-assembly to form the first electrode body on the first surface and to form the second electrode body on the second surface, the first electrode body being electrically isolated from the second electrode body, and a line normal to the first electrode body intersecting with a line normal to the second electrode body outside of the substrate.

In accordance with an aspect of at least one embodiment of the instant invention, there is provided a method of making an ion optics component, comprising: providing an electrically isolating substrate having a first major surface and a second major surface that is opposite the first major surface; machining away material, other than along an edge of the substrate, from the first major surface and from the second major surface to form an electrode support having a surface that is other than parallel to either the first major surface or the second major surface; machining away other material of the substrate to define a plurality of gaps at spaced-intervals along the surface of the electrode support, so as to define a plurality of surface segments, the surface segments separated one from the other by the gaps; and plating and masking the electrode support to form an electrode body on each of the surface segments and to form surface traces connecting between the electrode bodies that are formed on different surface segments of the plurality of surface segments, thereby forming a first electrode structure.

In accordance with an aspect of at least one embodiment of the instant invention, there is provided an ion optics component comprising: a first electrode sub-assembly comprising an electrically isolating material supporting a first plurality of electrode bodies defining at least two poles of a multipole ion guide structure, the first plurality of electrode bodies integrated with and in a predetermined alignment one relative to the other on the electrically isolating material of the first electrode sub-assembly; a second electrode sub-assembly comprising an electrically isolating material supporting a second plurality of electrode bodies defining at least two other poles of the multipole ion guide structure, the second plurality of electrode bodies integrated with and in a predetermined alignment one relative to the other on the electrically isolating material of the second electrode sub-assembly; and a mounting structure fixedly secured to the first electrode sub-assembly and to the second electrode sub-assembly, the mounting structure supporting the first plurality of electrode bodies in a predetermined alignment relative to the second plurality of electrode bodies.

In accordance with an aspect of at least one embodiment of the instant invention, there is provided an electrode assembly comprising: an electrically isolating material having supported thereon a plurality of electrode bodies defining at least two poles of a multipole ion guide structure, the plurality of electrode bodies integrated with and disposed in a predetermined alignment one relative to the other on the electrically isolating material, there being at least one bridge structure integrally formed in the electrically insulating material between adjacent electrode bodies of the plurality of electrode bodies and spacing the adjacent electrode bodies one from the other so as to define a space therebetween for guiding ions.

BRIEF DESCRIPTION OF THE DRAWINGS

The instant invention will now be described by way of example only, and with reference to the attached drawings, wherein similar reference numerals denote similar elements throughout the several views, and in which:

FIG. 6A is an enlarged partial view showing details of the ion guide component at step 70 of the method depicted in FIG. 5.

FIG. 6D is an enlarged partial view showing details of the ion guide component at step 76 of the method depicted in FIG. 5.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

A method of making ion optics components is described. In order to facilitate a better understanding of the broad concepts and principles that are encompassed by the invention, the method has been described using a specific and non-limiting example in which the ion optics component is a quadrupole ion guide. The method is equally applicable to making other ion optics components including, to name just a few other non-limiting examples, hexapole ion guides, octapole ion guides and ion funnels and ion guides with incorporated entry and exit lenses. It is also to be understood that the method may be used to form ion guides, collision cells and mass analyzers having ion-transport pathways that are straight, curved, "humped," etc. The term "humped" refers to an electrode structure in which the electrode bodies are formed so as to define an ion-transport pathway that curves in two directions, within a plane, along the length of the device.

Figure 1:
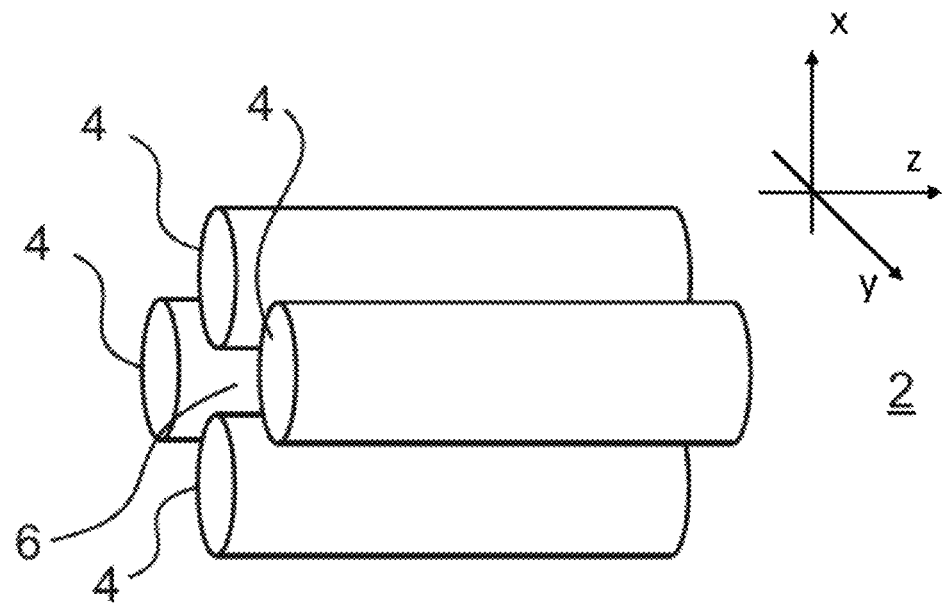
FIG. 1 is a simplified perspective drawing showing the electrode arrangement of a conventional quadrupole ion guide.
Figure 2:
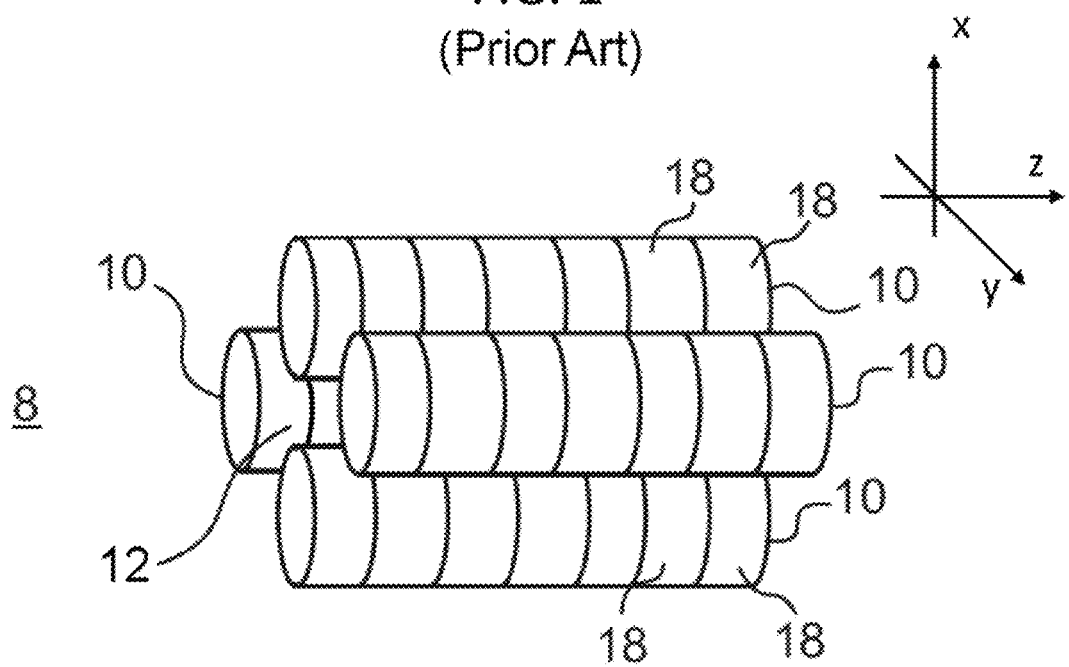
FIG. 2 is a simplified perspective drawing showing the electrode arrangement of a conventional quadrupole ion guide with segmented electrode rods.
Figure 3:
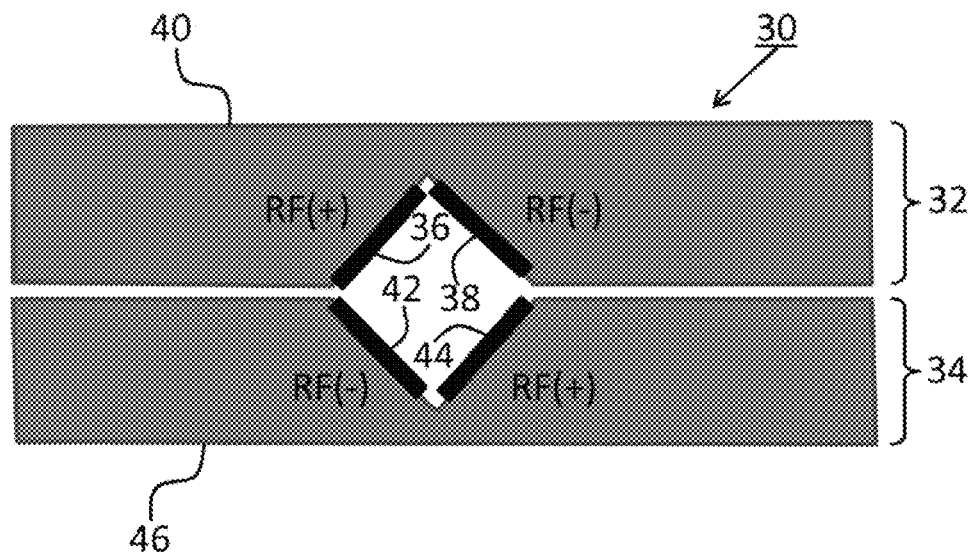
FIG. 3 is a simplified diagram showing a quadrupole ion guide comprising two electrode sub-assemblies, according to an embodiment of the invention.

FIG. 3 is an illustrative and simplified diagram depicting an end view of a quadrupole ion guide 30, which is formed by assembling together two electrode sub-assemblies 32 and 34 in accordance with an embodiment of the invention. Electrode sub-assembly 32 includes two electrode bodies 36 and 38 formed on a first substrate 40. Similarly, electrode sub-assembly 34 includes two electrode bodies 42 and 44 formed on a second substrate 46. The method of making the electrode sub-assemblies 32 and 34 is discussed in greater detail with reference to FIG. 5 and FIGS. 6A-G. Briefly, fabrication of the electrode sub-assembly 32 includes a step of machining the first substrate 40 to remove material therefrom and to thereby form features comprising at least two surfaces for supporting integration of the electrode bodies 36 and 38. More particularly, the at least two surfaces are other than parallel to the major surfaces of the substrate 40. The electrode bodies 36 and 38 are formed during subsequent plating and masking steps. Additional machining is performed as necessary to remove undesired material. The electrode sub-assembly 34 is formed in an analogous way.

Notably, each electrode sub-assembly 32 and 34 supports two of the four electrode bodies that define an ion-transport volume of the quadrupole ion guide 30. Final assembly of the ion guide 30 is achieved by aligning the electrode sub-assemblies 32 and 34 one with the other. Since the electrode bodies 36 and 38 are pre-aligned one relative to the other on the substrate 40 and the electrode bodies 40 and 42 are pre-aligned one relative to the other on the substrate 46, it is not necessary to align four separate electrode bodies during the final assembly step. Once the electrode sub-assemblies 32 and 34 are assembled together, the electrode bodies 36, 38, 42 and 44 form two electrode-pairs that are aligned with and opposed across the centerline of the quadrupole ion guide 30.

Figure 4:
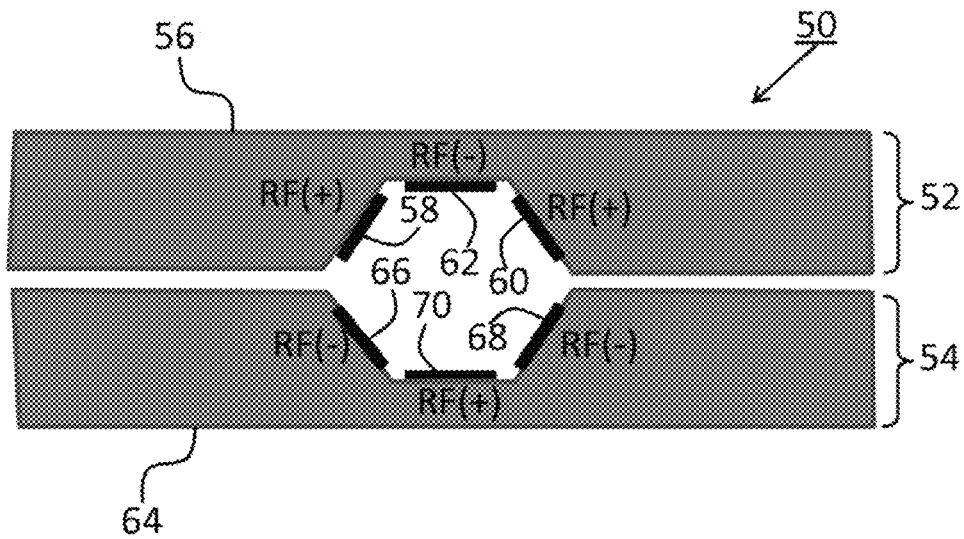
FIG. 4 is a simplified diagram showing a hexapole ion guide comprising two electrode sub-assemblies, according to an embodiment of the invention.

FIG. 4 is an illustrative and simplified diagram depicting an end view of a hexapole ion guide 50, which is formed by assembling together two electrode sub-assemblies 52 and 54 in accordance with an embodiment of the invention. The electrode subassemblies 52 and 54 are formed using substantially the same method that is described with reference to FIG. 3, but the machining step produces features that are suitable for forming a hexapole ion guide structure. That is to say, machining of substrate 56 produces features comprising at least two surfaces are other than parallel to the major surfaces of the substrate 56 as well as one surface that is substantially parallel to the major surfaces of the substrate 56. These three surfaces are for supporting integration of the electrode bodies 58, 60 and 62, which are formed during subsequent plating and masking steps. The electrode sub-assembly 64 is formed in an analogous way, and supports three other electrode bodies 66, 68 and 70. Once the electrode sub-assemblies 52 and 54 are assembled together the electrode bodies 58, 60, 62, 66, 68 and 70 form three electrode-pairs, aligned with and opposed across the centerline of the hexapole ion guide 50. This approach avoids the need to individually align the six rods of a conventional hexapole ion guide.

As a person having ordinary skill in the art will appreciate, other multipole structures may be fabricated using the general approach that is shown in FIGS. 3 and 4. In a general case two electrode sub-assemblies are formed, each one of the two electrode sub-assemblies supporting half of the total number of electrode bodies of the multipole structure. As such, for quadrupole, hexapole and octapole structures each one of the electrode sub-assemblies supports two, three and four electrode bodies, respectively.

Figure 5:
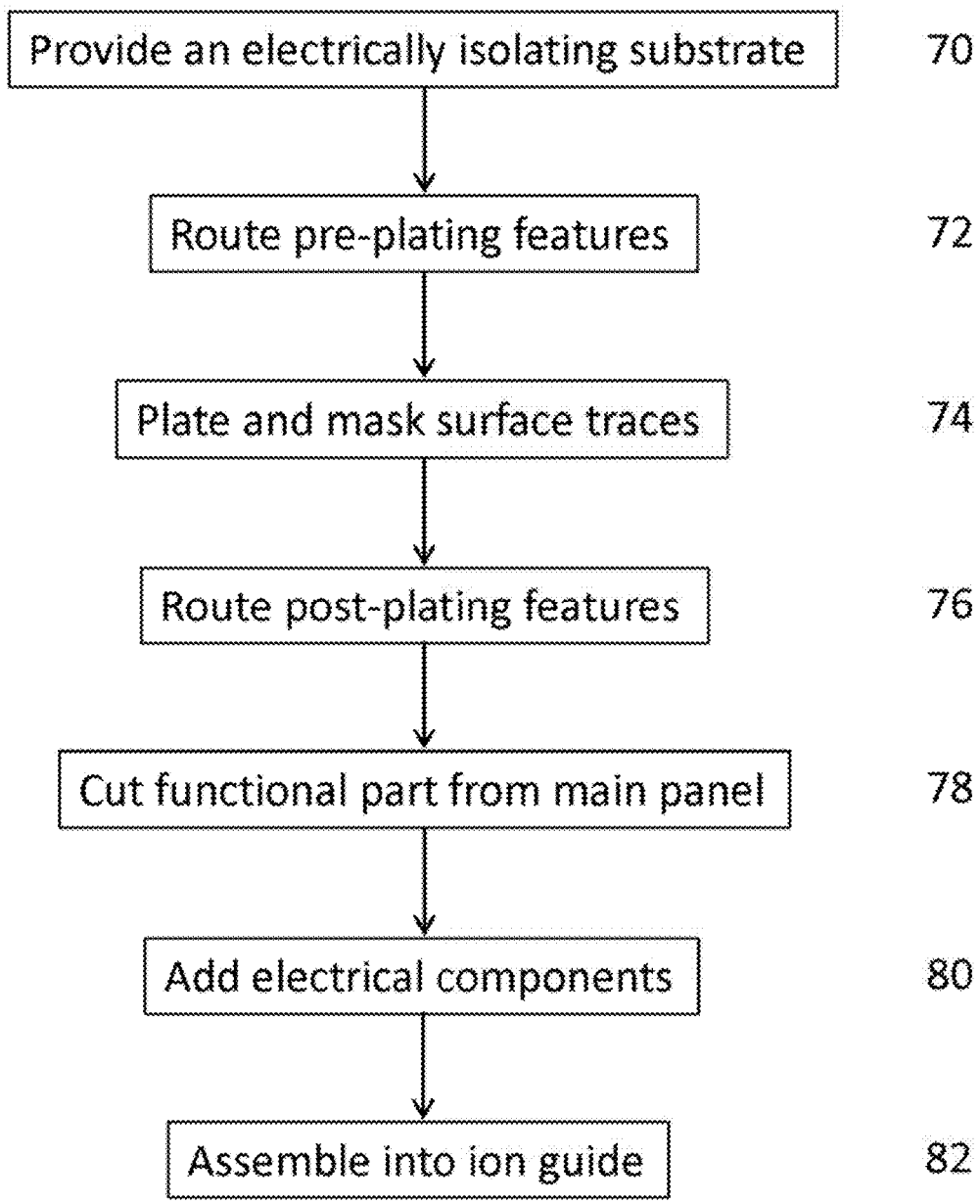
FIG. 5 is a simplified flow diagram for a method of making an ion guide component, according to an embodiment of the invention.
Figure 7:
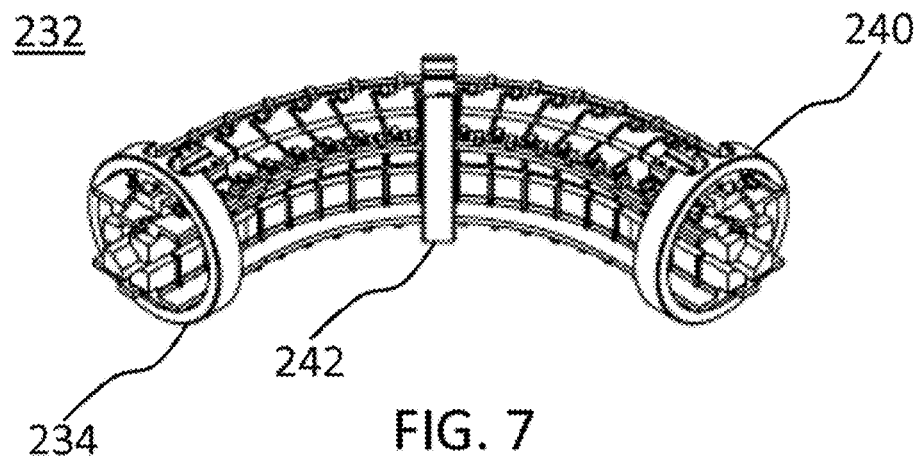
FIG. 7 shows a curved ion guide component according to an embodiment of the invention.
Figure 8:
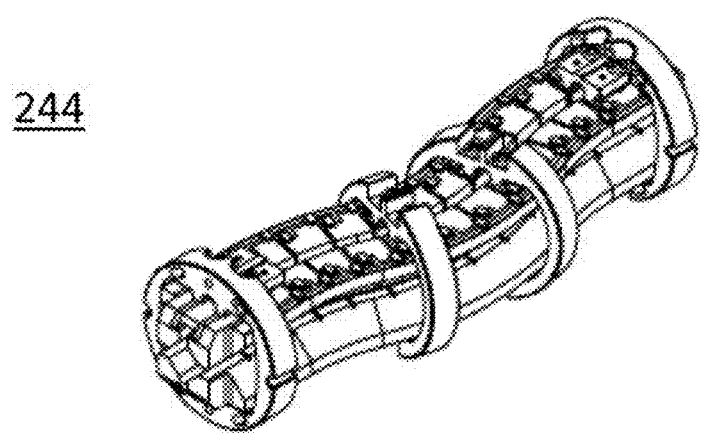
FIG. 8 shows a "humped" ion guide component according to an embodiment of the invention.
Figure 9:
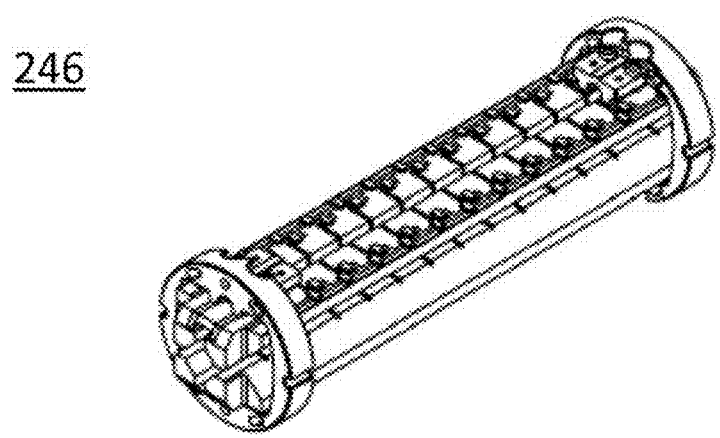
FIG. 9 shows a linear ion guide component according to an embodiment of the invention.

FIG. 5 shows a simplified flow diagram for a method of making an ion guide in accordance with an embodiment of the invention. FIGS. 6A-G are partial, perspective views showing enlarged detail of an ion guide structure at different stages of fabrication corresponding to steps 70 to 82 of the method of FIG. 5, respectively. By way of a specific and non-limiting example, the ion guide shown in FIGS. 6A-G is a quadrupole ion guide having a curved ion-transport pathway. FIG. 7 is a perspective view of the entire ion guide device 232 with a curved ion-transport pathway, in an assembled condition. Of course, the method of FIG. 5 may be used to make ion guides or mass analyzers that have ion-transport pathways of various other shapes. For instance FIG. 8 is a perspective view of a quadrupole ion guide device 244 with a "humped" ion-transport pathway, which may be made using the method of FIG. 5. FIG. 9 is a perspective view of a quadrupole ion guide device 246 with a straight ion-transport pathway, which may also be made using the method of FIG. 5.

Now with specific reference to FIGS. 5 and 6A, at step 70 an electrically isolating substrate 100 is provided. The substrate 100 has a first major surface 102 and a second major surface 104 that is opposite and parallel to the first major surface 102, and has a typical thickness of at least 0.062 inch. In general, the substrate exhibits at least some of the following properties: high dielectric strength, low RF (radio-frequency) losses, low coefficient of thermal expansion, good machinability and has a static dissipative surface. FR-4A is one specific and non-limiting example of a suitable substrate material. Of course, other substrate materials known in the PCB art may be used instead of FR-4A.

Figure 6B:
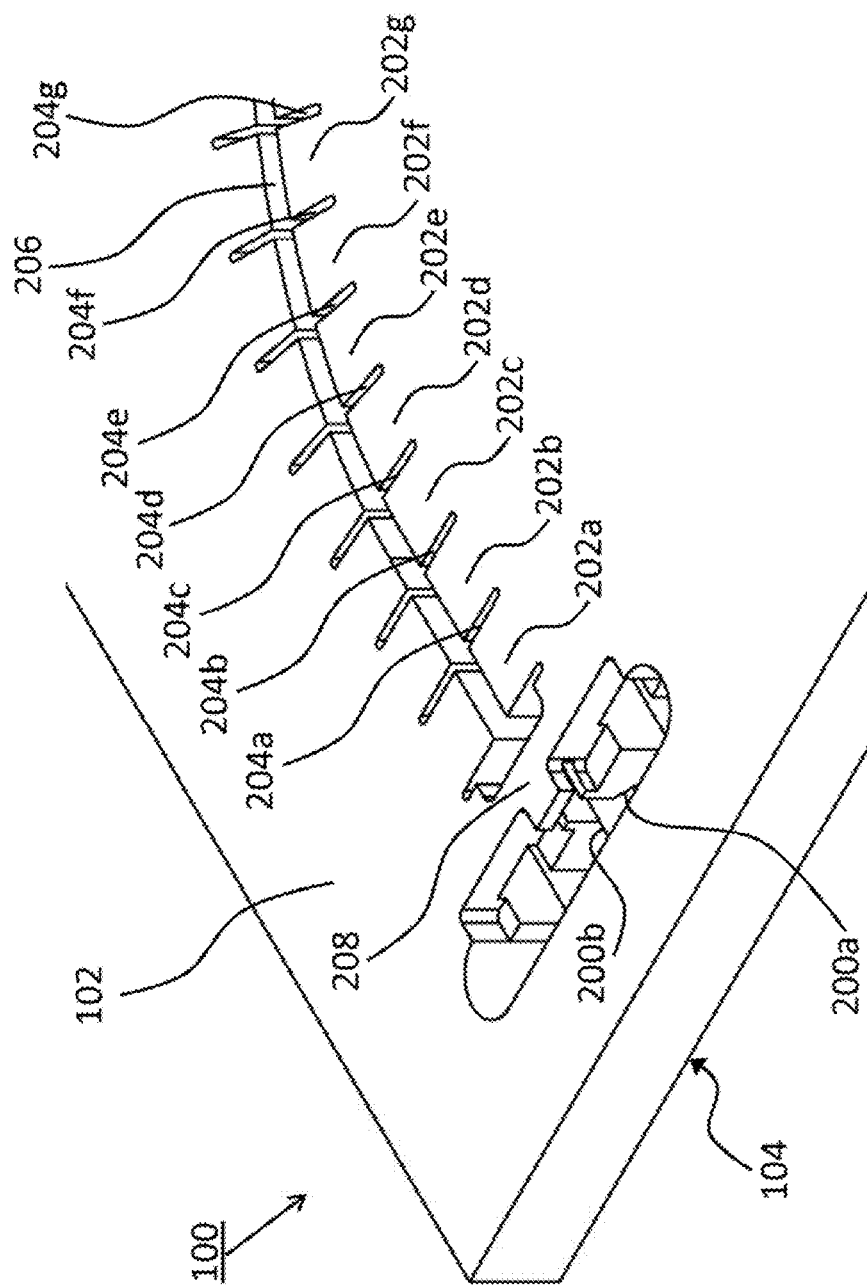
FIG. 6B is an enlarged partial view showing details of the ion guide component at step 72 of the method depicted in FIG. 5.

With reference to FIGS. 5 and 6B, at step 72 machining is performed to define pre-plating features of the ion guide structure. The machining is performed using routing or milling techniques that are used in PCB technologies. As is shown in FIG. 6B, material is machined away from the second major surface 104 so as to define features 200a and 200b having surfaces that are other than parallel to either the first major surface 102 or the second major surface 104. The surfaces of features 200a and 200b are for supporting electrode bodies, which are formed during subsequent steps, the surfaces being oriented such that the electrode bodies cooperate to define half of the ion transport volume of the ion guide. Although the surfaces of the features 200a and 200b are shown as planar surfaces in FIG. 6B, it is to be understood that alternatively the surfaces of the features 200a and 200b are curved, such as for instance rounded or hyperbolic surfaces. Further, it is to be understood that the machining operations may extend through the entire thickness of the substrate or through only a portion of the thickness of the substrate to form blind features, e.g., features 200a and 200b. By way of a specific and non-limiting example, the substrate material is machined away to a depth that is between about 0.004 inch and the material thickness of the substrate 100.

Material is also machined away from the first major surface 102 of the substrate 100, so as to form other features defining a plurality of first segments 202a-202g, etc. along the length of the ion guide structure. In particular, gaps 204a-204g, etc. are formed in the substrate between the first major surface 102 and the surface of the formed feature 200a. The gaps 204a-204g, etc. serve to segment the surface of the feature 200a, and to provide electrical isolation between adjacent electrode structures that are formed on the segmented surface. Similar gaps (not labeled) are also formed in the substrate between the first major surface 102 and the surface of the formed feature 200b, thereby defining a plurality of second segments (not labeled) aligned with the plurality of first segments and separated therefrom by a gap 206. The gap 206 extends through the thickness of substrate 100, and accordingly it separates the surface of feature 200a from the surface of feature 200b. In the example that is shown in FIG. 6B, a portion 208 of the substrate material proximate each end of the ion guide structure is not machined away when the gap 206 is formed.

Figure 6C:
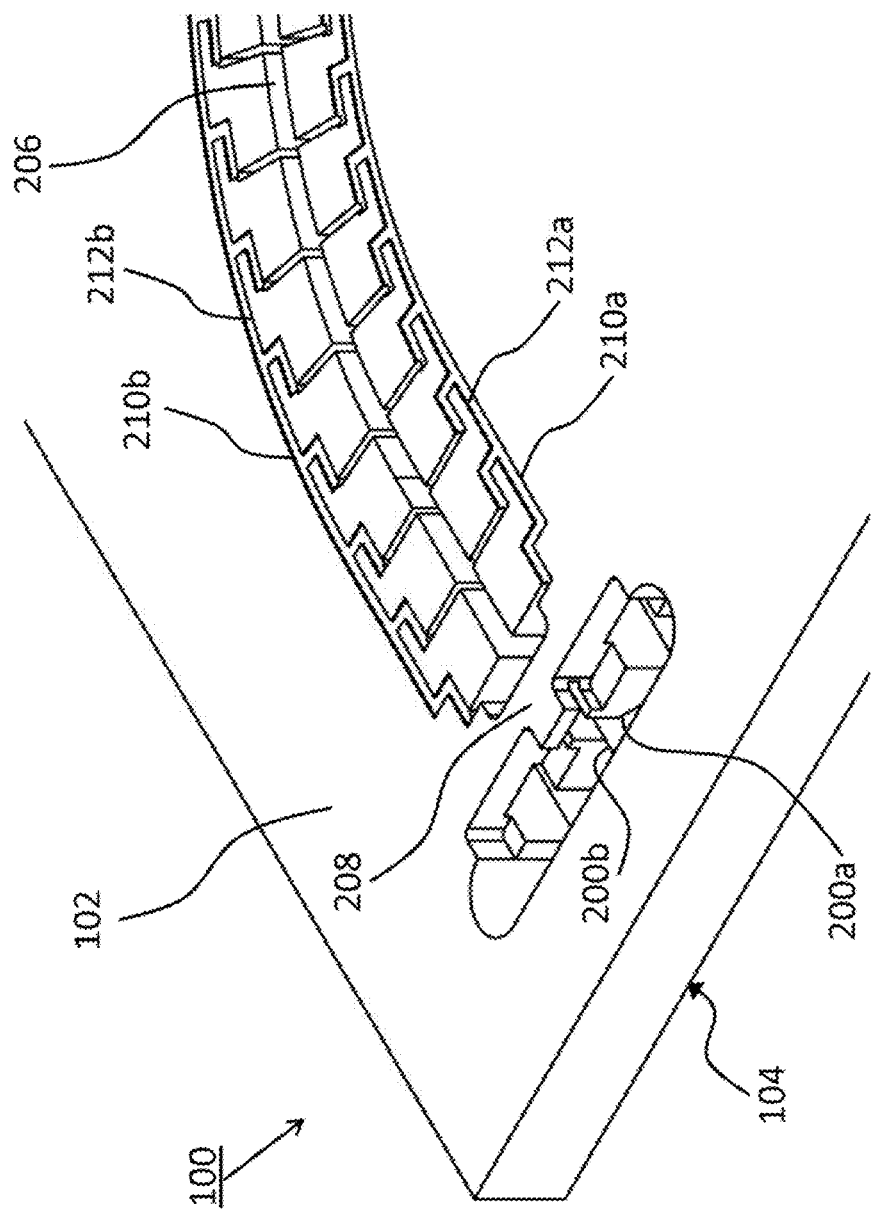
FIG. 6C is an enlarged partial view showing details of the ion guide component at step 74 of the method depicted in FIG. 5.

With reference to FIGS. 5 and 6C, at step 74 plating and masking is performed to define surface traces and electrode structures on the substrate 100. In particular, traces 210a and 212a are formed on the first major surface 102 along one side of gap 206, and traces 210b and 212b are formed on the first major surface 102 along the opposite side of gap 206. The traces 210a and 212a form conductive pathways interconnecting the first plurality of segments, and the traces 210b and 212b form conductive pathways interconnecting the second plurality of segments. In the interest of clarity, the individual segments have not been labeled in FIG. 6C. Metallization of the surfaces of the features 200a and 200b, followed by post-plating operations performed to completely isolate the segments and bridge feature, results in the formation of segmented electrode bodies, which are separated one from the other by gap 206.

With reference to FIGS. 5 and 6D, at step 76 additional machining is performed to define post-plating features, and to remove undesired material as necessary. In particular, mounting structures 214a-d and alignment features 216a-b are formed by routing, milling, drilling, etc. In addition, the portion 208 of the substrate material proximate the ends of the ion guide structure is machined to form a bridge structure 218. This post-plating operation completely isolates the electrode segments, which are formed by metallizing the surfaces of the features 200a and 200b, from the resulting bridge structure 218.

Figure 6E:
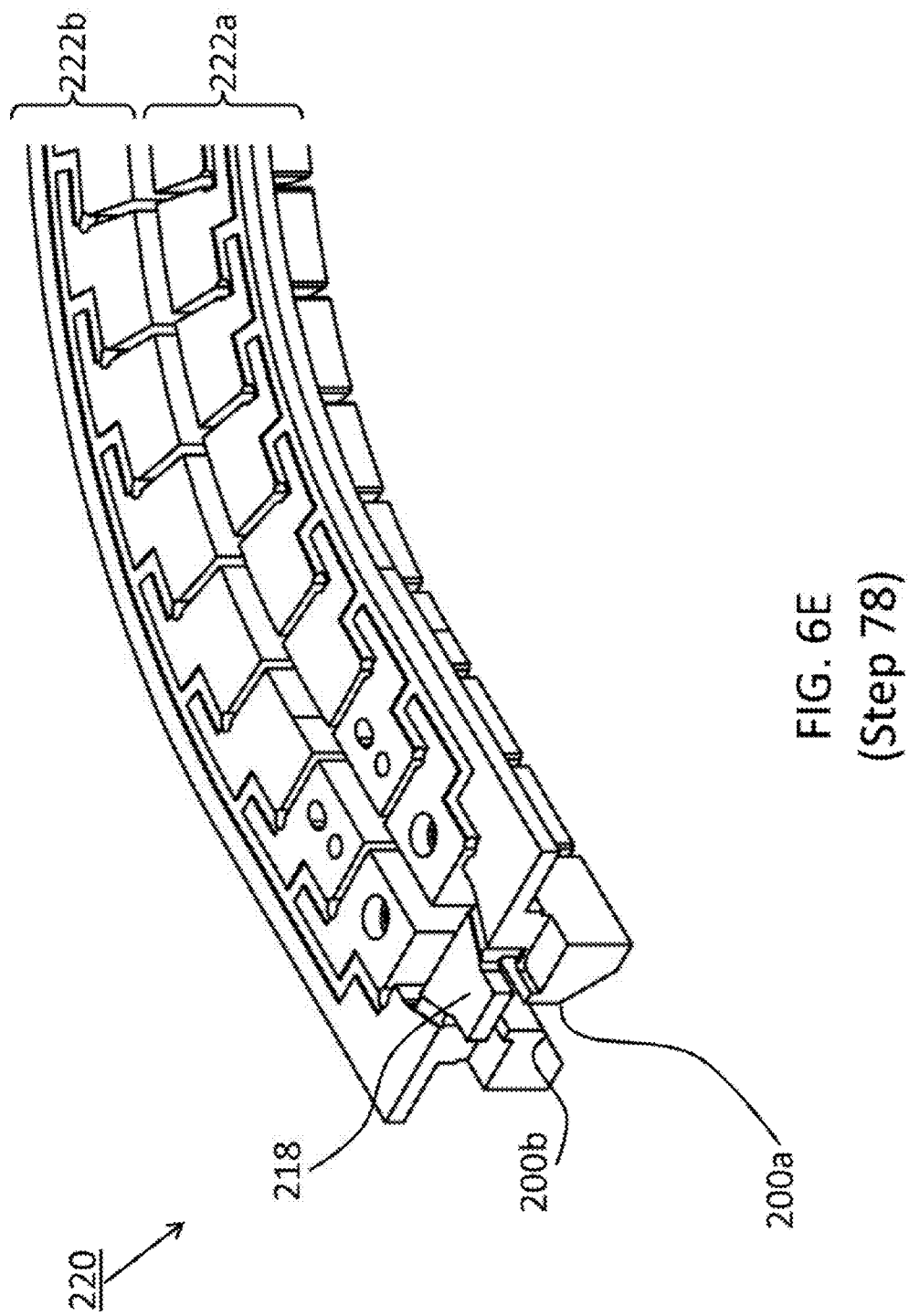
FIG. 6E is an enlarged partial view showing details of the ion guide component at step 78 of the method depicted in FIG. 5.

With reference to FIGS. 5 and 6E, at step 78 the electrode sub-assembly, which is shown generally at 220, is removed from the surrounding material of the substrate 100. The electrode sub-assembly 200 comprises two substantially separate electrode structures 222a and 222b, the opposite ends of which are joined together via bridge structures 218 formed of electrically insulating material. As such, the electrode structures 222a and 222b are pre-aligned one relative to the other and form a single sub-assembly.

Figure 6F:
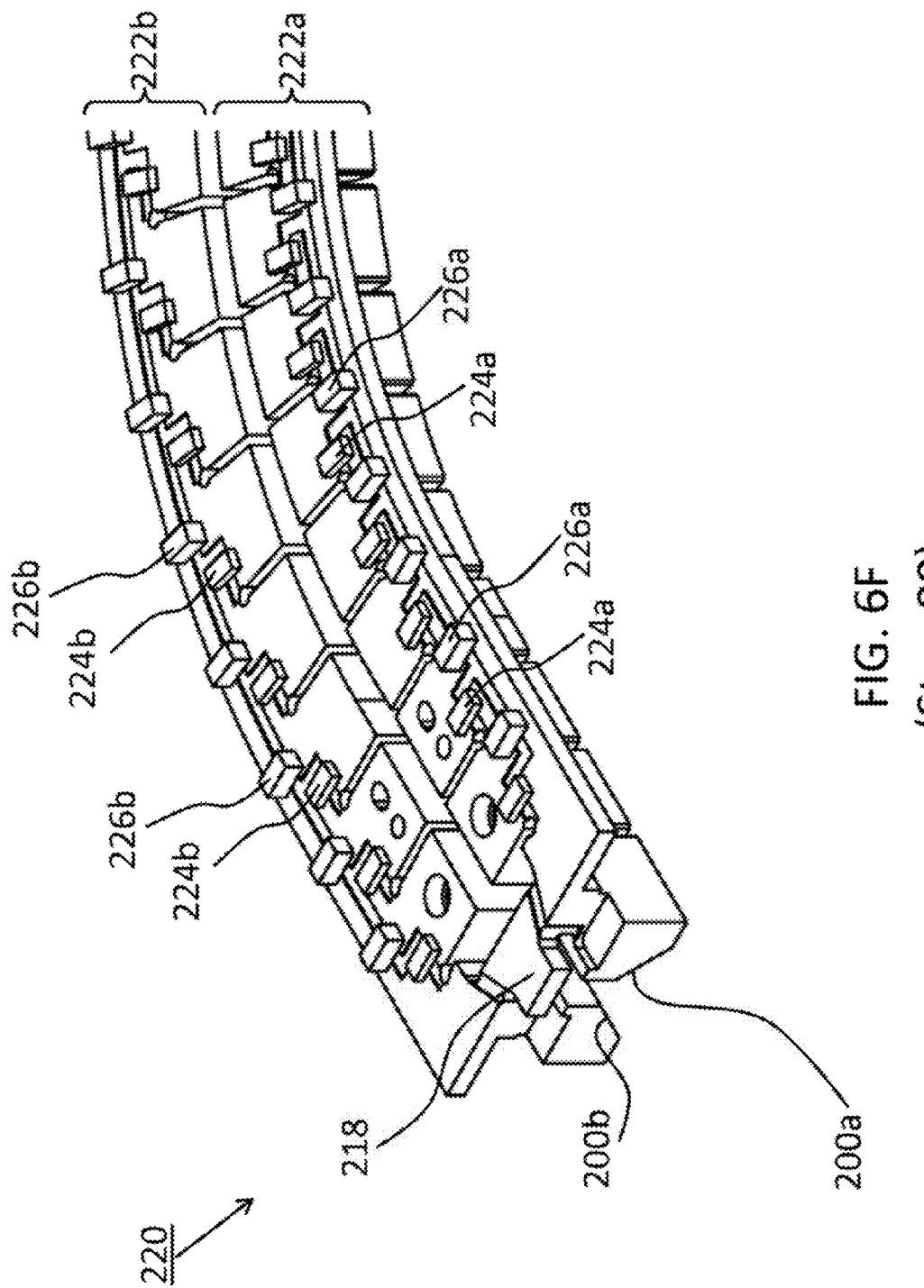
FIG. 6F is an enlarged partial view showing details of the ion guide component at step 80 of the method depicted in FIG. 5.

With reference to FIGS. 5 and 6F, at step 80 electrical components, including resistors 224a and 224b and capacitors 226a and 226b, are added. As such, each segment of the electrode structure 222a is connected to an adjacent segment by a resistor 224a and a capacitor 226a. Similarly, each segment of the electrode structure 222b is connected to an adjacent segment by a resistor 224b and a capacitor 226b. During use, the resistors 224a and 224b set up respective voltage dividers along the lengths of the electrode structure 222a and 222b, respectively. The resultant voltages on the segmented electrode structures 222a and 222b form a range of voltages, often a range of step-wise monotonic voltages. The voltages create a voltage gradient in the axial direction that urges ions along an ion path through the ion-transport volume of the ion guide.

Figure 6G:
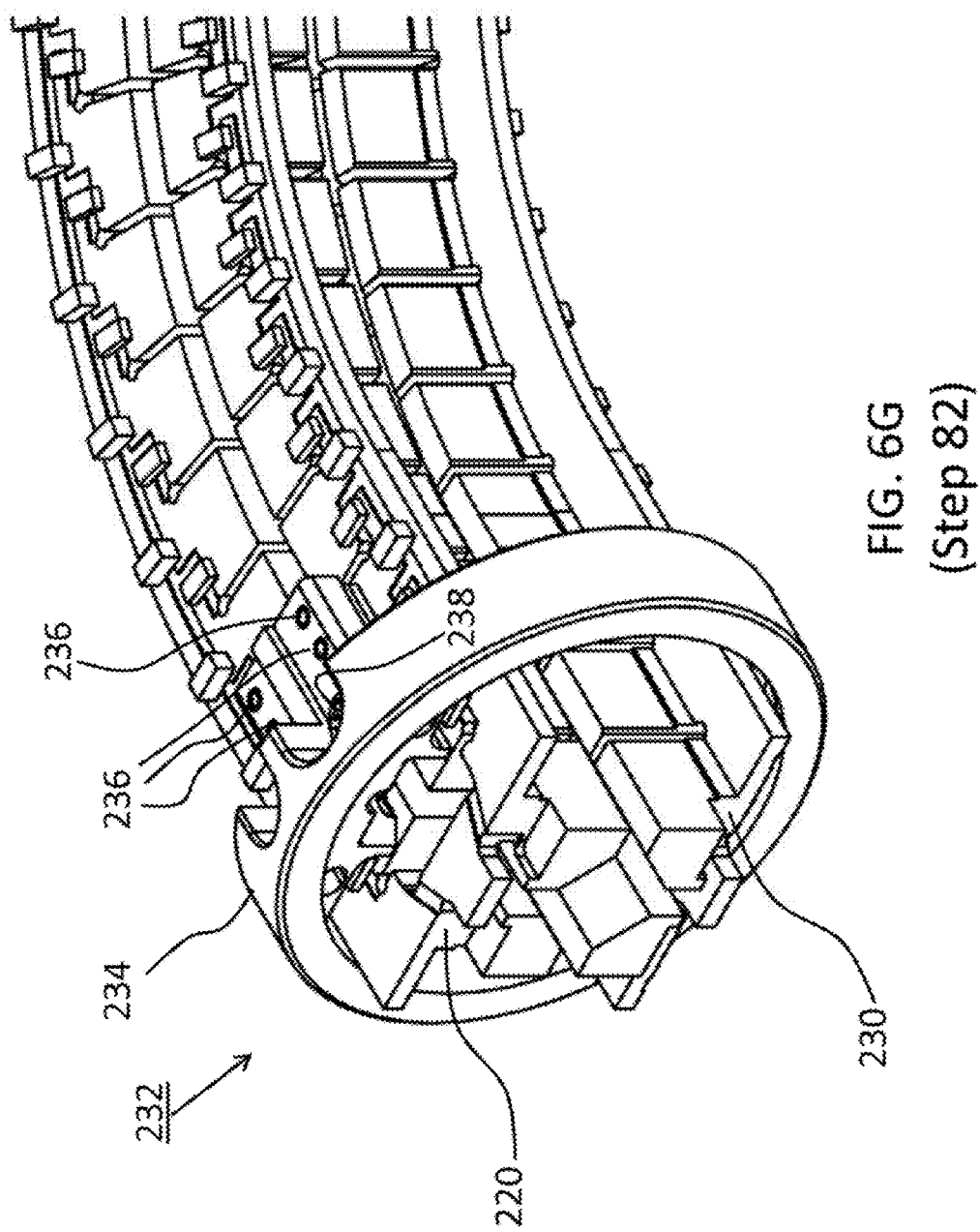
FIG. 6G is an enlarged partial view showing details of the completed ion guide component at step 82 of the method depicted in FIG. 5.
Figure 14:
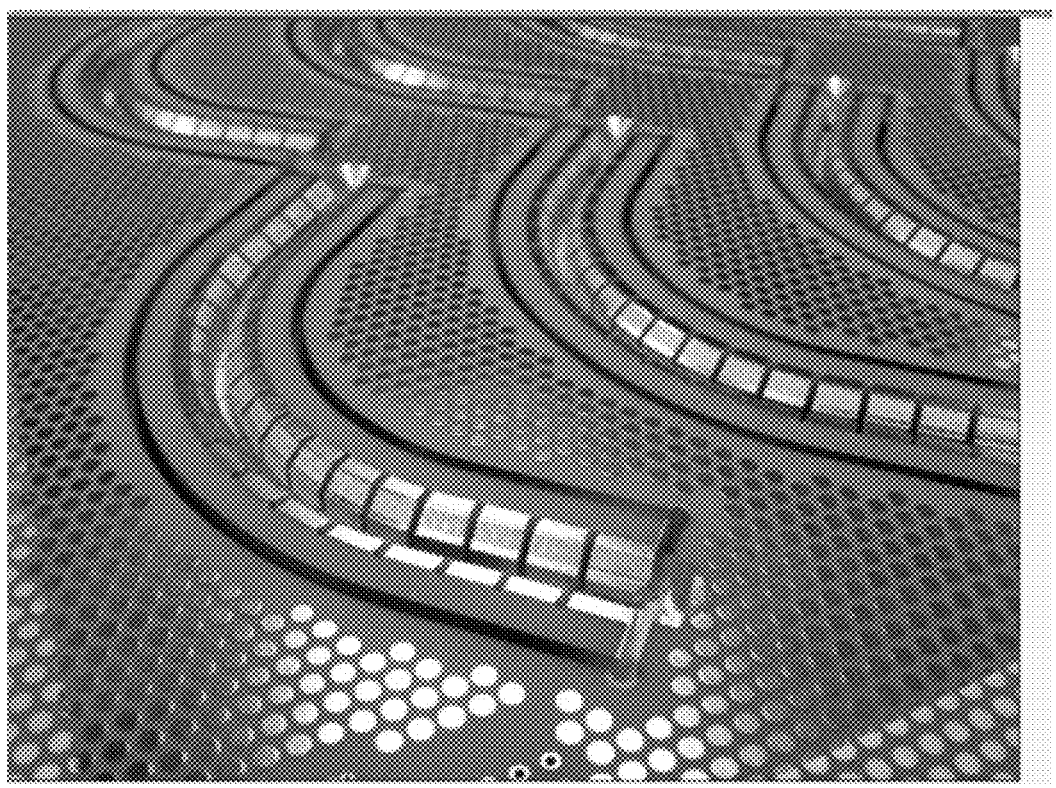
FIG. 14 shows a plurality of curved ion guide structures formed within a same wafer of substrate material.

With reference to FIGS. 5 and 6G, at step 82 two complementary electrode sub-assemblies 220 and 230, both of which are fabricated according the method of FIG. 5, are assembled together to form a completed ion guide component 232. The two electrode sub-assemblies 230 and 240 are fabricated as mirror images of one another. For instances, plural electrode sub-assemblies including the sub-assemblies 230 and 240 are fabricated from a single wafer of the substrate material. The plural electrode sub-assemblies are preferably laid out to minimize wastage of the substrate material, for instance as is shown in FIG. 14 or in another suitable fashion.

Referring still to FIG. 6G, a mounting ring 234 is secured to the electrode sub-assemblies 220 and 230. In particular, the mounting ring 234 is secured to the electrode sub-assembly 220 via the alignment features 216a-b and the mounting structures 214a-d. For instance, two threaded members 238 engage an internal thread of a respective one of the alignment features 216a-b, for securing the mounting ring 234 to the electrode sub-assembly 220. In addition, the mounting ring 234 includes a plurality of pins 236, which engage the mounting structures 214a-d. The mounting ring 234 is secured to the electrode sub-assembly 230 in a similar fashion. As is shown in FIG. 7, a second mounting ring 240 is secured to the opposite end of the ion guide component 232, and a third mounting ring 242 optionally is secured to the ion guide component and intermediate the mounting rings 234 and 240, such as for instance approximately half-way along the length of the ion guide component 232, if additional alignment and support is required. In practice, the number of mounting rings that are used to secure the two electrode sub-assemblies together depends, at least in part, upon the geometry of the completed ion guide component. As is shown in FIGS. 7-9, three mounting rings may be used in the case of a curved ion guide 232, four mounting rings may be used in the case of a "humped" ion guide 244, and two mounting rings may be used in the case of a straight ion guide 246.

Figure 10A:
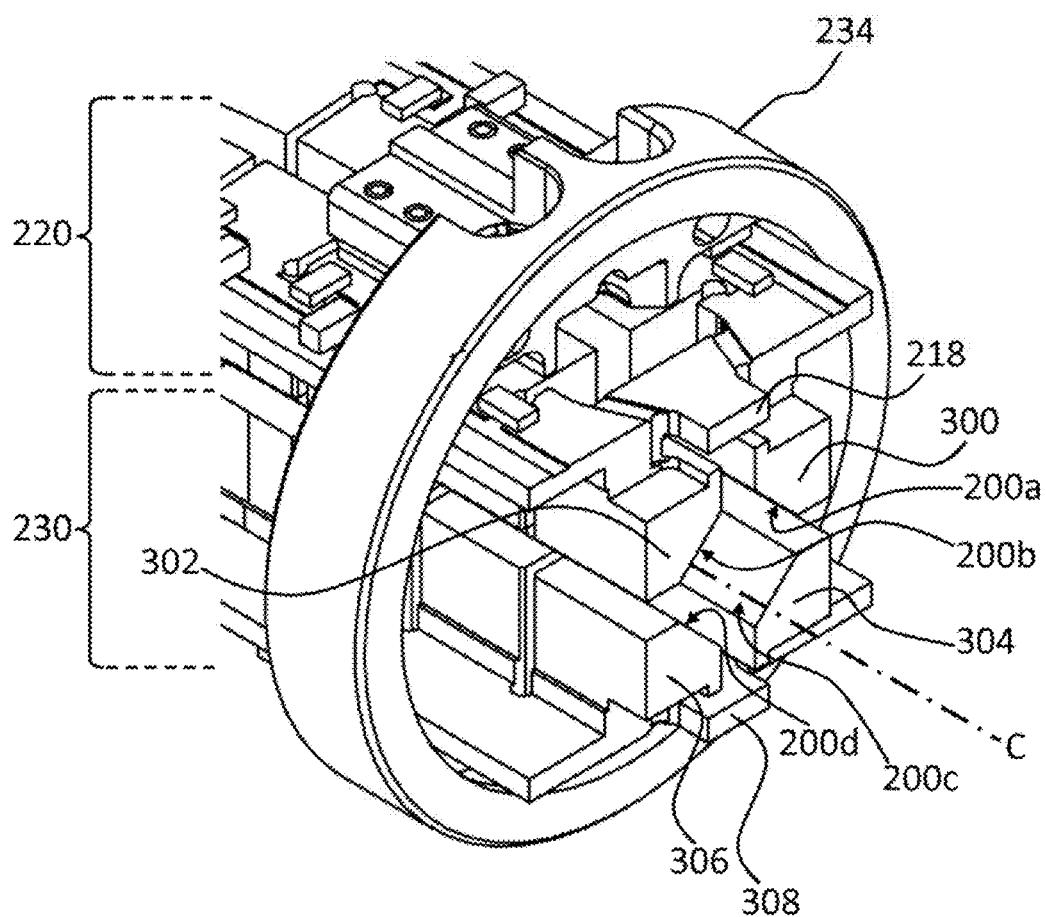
FIG. 10A is an enlarged perspective view showing one end of a curved ion guide component with bridged electrode sub-assemblies, according to an embodiment of the invention.

FIG. 10A is an enlarged perspective view showing one end of the ion guide component 232 of FIG. 7. Shown more clearly in FIG. 10A are features 300 and 302 of the electrode subassembly 220, which are formed during the machining step 72 of the method that is described with reference to FIG. 5. The surfaces 200a and 200b of features 300 and 302, respectively, each support metallization defining electrode bodies facing toward the centerline C of the ion guide component 232. Bridge 218 mechanically connects the features 300 and 302 and electrically isolates the electrode bodies defined on the surfaces 200a and 200b of the features 300 and 302, respectively. Further shown in FIG. 10A are features 304 and 306 of the electrode sub-assembly 230, which are also formed during the machining step 72 of the method that is described with reference to FIG. 5. The surfaces 200c and 200d of features 304 and 306, respectively, each also support metallization defining electrode bodies facing toward the centerline C of the ion guide component 232. Bridge 308 mechanically connects the features 304 and 306 and electrically isolates the electrode bodies that are defined on the surfaces 200c and 200d of the features 304 and 306, respectively. The electrode bodies defined on the surfaces 200a-d form two pairs of electrode, which are aligned with and opposed across the centerline C of the ion guide component 232.

Figure 10B:
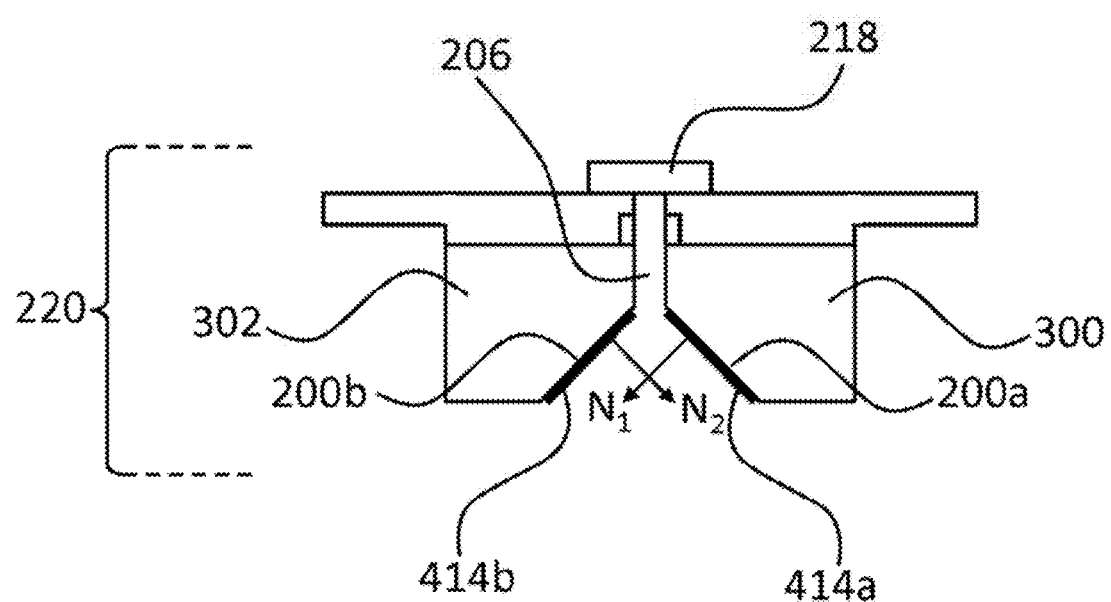
FIG. 10B is a simplified end view of one of the bridged electrode sub-assemblies of FIG. 10A.

FIG. 10B is a simplified end view of the bridged electrode sub-assembly 220 of FIG. 10A. A first electrode body 414a is defined on the machined surface 200a of the feature 300 and a second electrode body 414b is defined on the machined surface 200b of the feature 302. The gap 206, which is formed between the features 300 and 302, electrically isolates the first electrode body 414a from the second electrode body 414b. Bridge 218, which is formed of the electrically isolating substrate material, maintains a predetermined alignment between the first electrode body 414a and the second electrode body 414b. In the specific and non-limiting example that is shown in FIG. 10B, the surfaces 200a and 200b and the corresponding electrode bodies 414a and 414b are planar. Alternatively the surfaces 200a and 200b are curved, for instance rounded or hyperbolic in cross-sectional profile, in which case the corresponding electrode bodies 414a and 414b would also be curved, for instance defining a rounded or hyperbolic electrode surface.

Referring still to FIG. 10B, an open volume or space is formed between the electrode bodies 414a and 414b during the step of machining away the substrate material, which volume or space defines half of an ion-transport volume in the completed ion optics component. In the specific and non-limiting example that is shown in FIG. 10B, the ion optics component is a quadrupole ion guide. The first electrode body 414a and the second electrode body 414b each define one of the four generally rod-shaped electrodes of the quadrupole structure. More particularly, the first electrode body 414a faces generally toward the second electrode body 414b, and form an angle of approximately 90° with the second electrode body 414b. A line $N_1$ drawn normal to the surface of the first electrode body 414a intersects with a line $N_2$ that is drawn normal to the surface of the second electrode body 414b outside of the substrate. That is to say, the intersection point of lines that are drawn normal to the surfaces of the first and second electrode bodies lies within the volume or space between the electrode bodies, not within material of the substrate. When electrode bodies with curved electrode surfaces are formed, such as for instance rounded or hyperbolic electrode surfaces, then at least some of the lines that are drawn normal to the electrode surfaces intersect outside of the substrate. In any case, the machining step forms features with surfaces supporting the integration of electrode bodies adjacent to a volume or space that defines, in the completed ion optics component, part of the ion-transport volume.

Figure 10C:
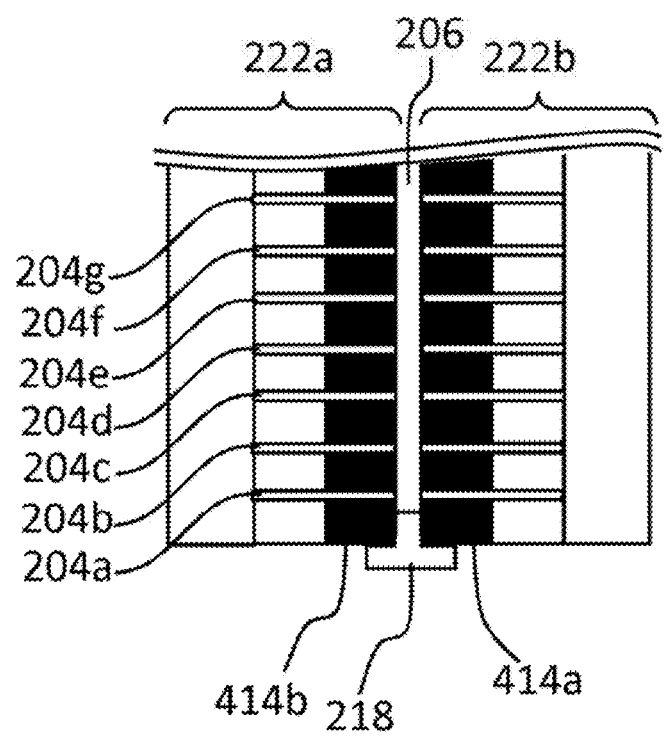
FIG. 10C is a partial bottom view showing an end section of one of the bridged electrode sub-assemblies of FIG. 10A.

FIG. 10C is a partial bottom view showing an end section of one of the bridged electrode sub-assemblies of FIG. 10A. The electrode bodies 414a and 414b are angled into the plane of the page in FIG. 10C, defining a volume or space therebetween as described with reference to FIG. 10B. The electrode bodies 414a and 414b are each segmented into a plurality of segments, adjacent segments being separated one from another by gaps of the plurality of gaps 204a-g.

Figure 10D:
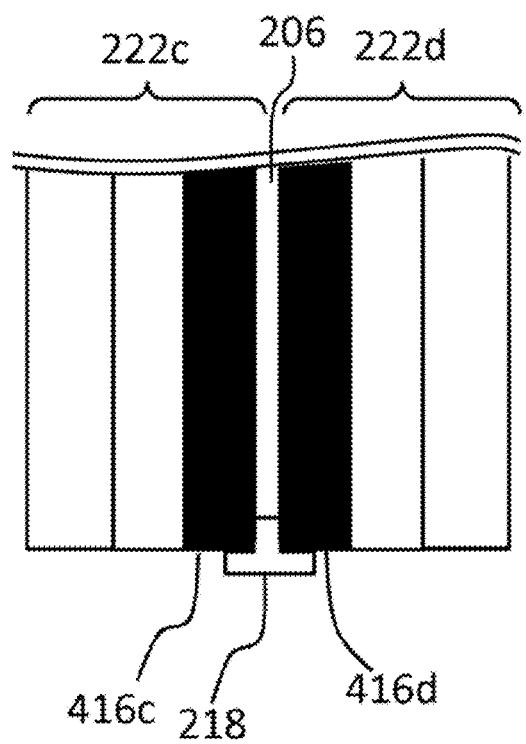
FIG. 10D is a partial bottom view showing an end section of an alternative bridged electrode sub-assembly having non-segmented electrode bodies.

FIG. 10D is a partial bottom view showing an end section of an alternative bridged electrode sub-assembly having non-segmented electrode bodies. The alternative bridged electrode sub-assembly is substantially similar to the electrode-subassembly shown in FIG. 10C, except the electrode bodies 416c and 416d of the electrode structures 222c and 222d, respectively, are not segmented.

Figure 11:
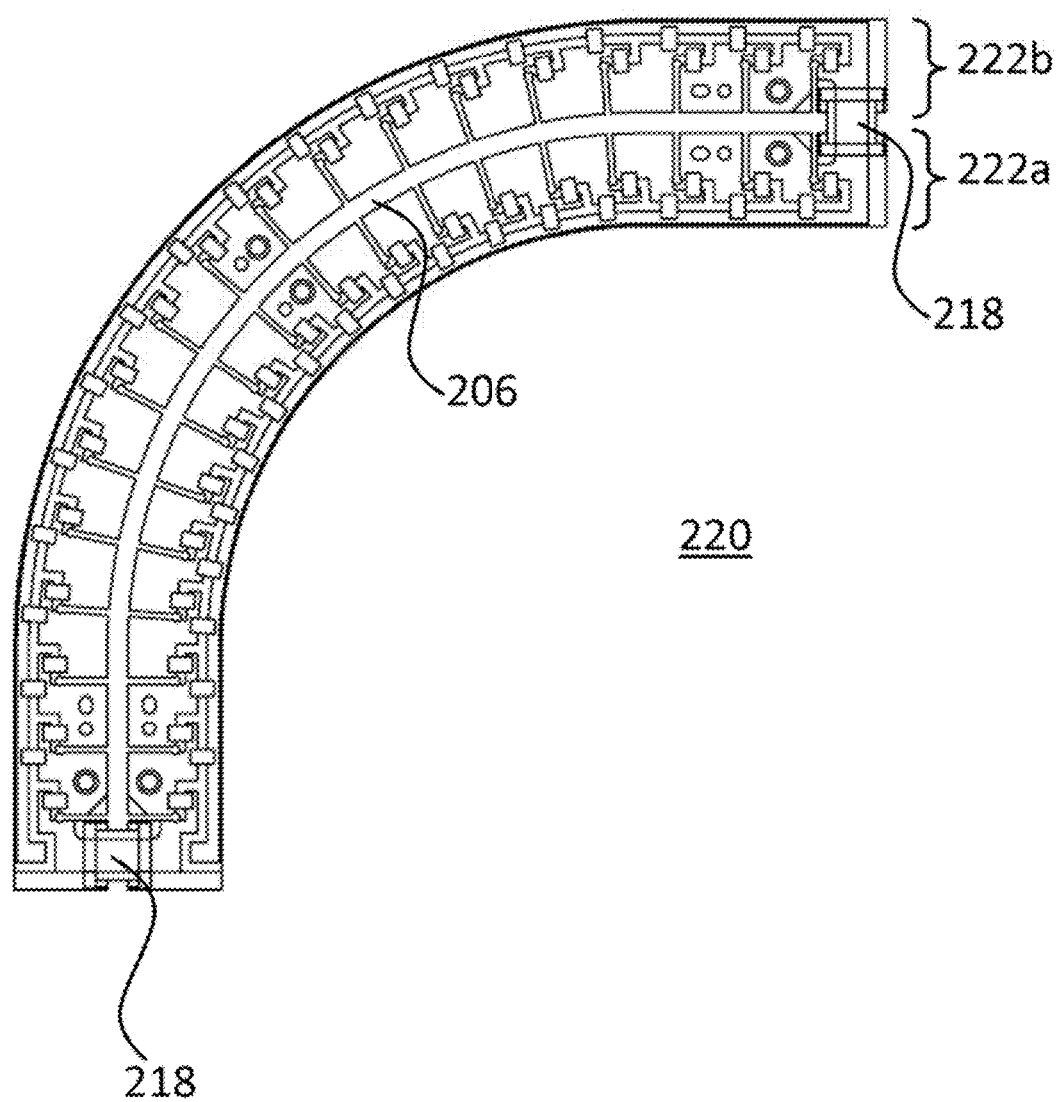
FIG. 11 is top plan view showing one of the electrode subassemblies of the curved ion guide component of FIG. 10.

FIG. 11 is top plan view of the electrode sub-assembly 220, which forms a part of the curved ion guide component 232. FIG. 11 shows the bridge 218 between the electrode structures 222a and 222b at each of the opposite ends of the electrode sub-assembly 220. Other than at the bridges 218, the electrode structures 222a and 222b are separated one from the other by the gap 206. Bridges 218 maintain a predetermined alignment between the electrode structures 222a and 222b, and also electrically isolate the electrode structures 222a and 222b one from the other.

Figure 12:
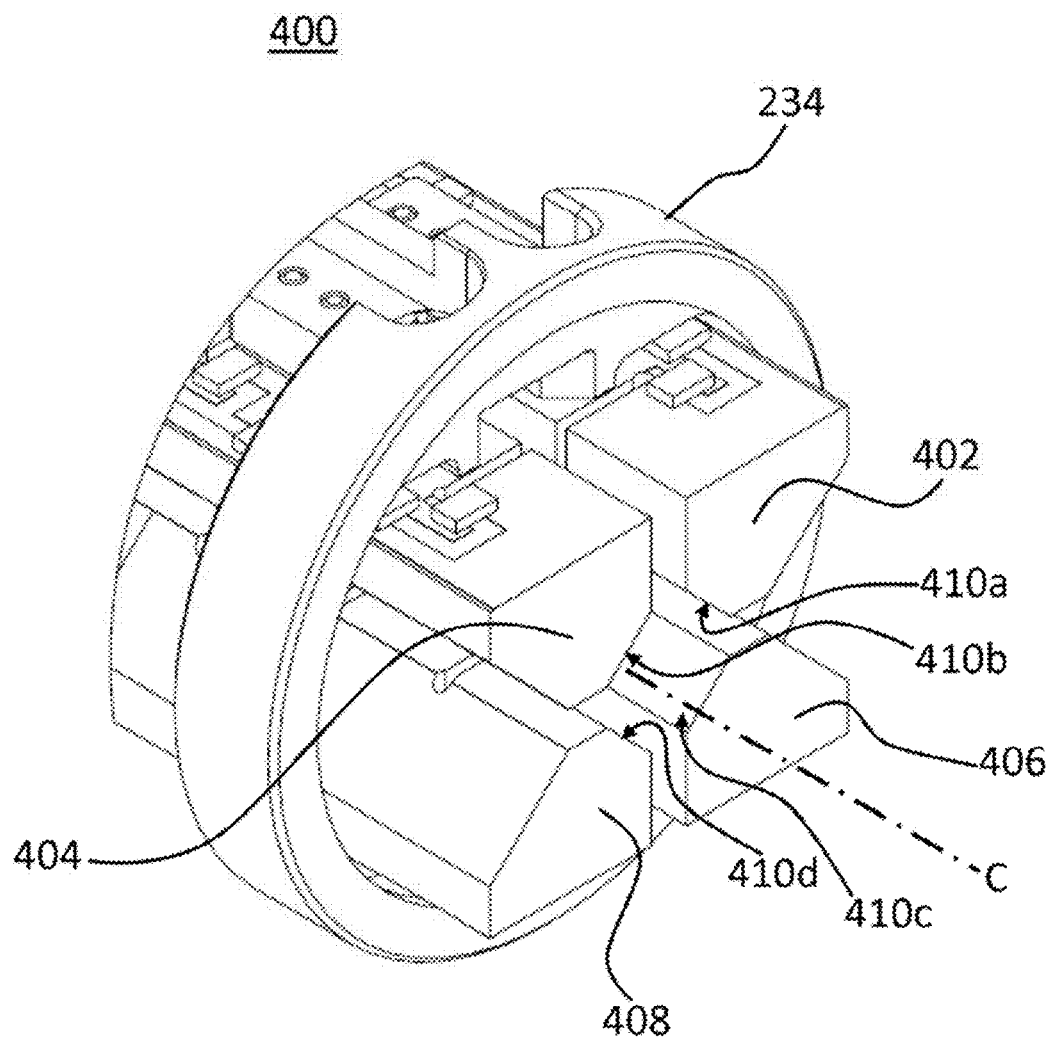
FIG. 12 is an enlarged perspective view showing one end of a curved ion guide component with un-bridged electrode structures, according to an embodiment of the invention.

FIG. 12 is an enlarged perspective view showing one end of an ion guide component 400, according to an embodiment of the invention. The ion guide component 400 comprises features 402, 404, 406 and 408, which are similar to the features 300, 302, 304 and 306 of the ion guide component 232. In particular, each of the features 402, 404, 406 and 408 is formed according to the method that is described with reference to FIG. 5. In the ion guide component 400, unlike the ion guide component 232, the features 402, 404, 406 and 408 are formed as separate substantially rod-shaped electrode structures and are not mechanically coupled via a bridge to form electrode sub-assemblies. As such, during the assembly step 82 of the method that is described with reference to FIG. 5, it is necessary to align four separate electrode structures instead of aligning two electrode sub-assemblies each having two electrode structures. That said, the surfaces 410a, 410b, 410c and 410d of the features 402, 404, 406 and 408, respectively, each support metallization defining electrode bodies facing toward the centerline C of the ion guide component 400. Further, the four separate electrode structures of the ion guide component 400 have generally the same shape and features as corresponding portions of the electrode structures 222a and 222b of the ion guide component 232, but they are not arranged into pairs and mechanically coupled by a bridge.

Figure 13:
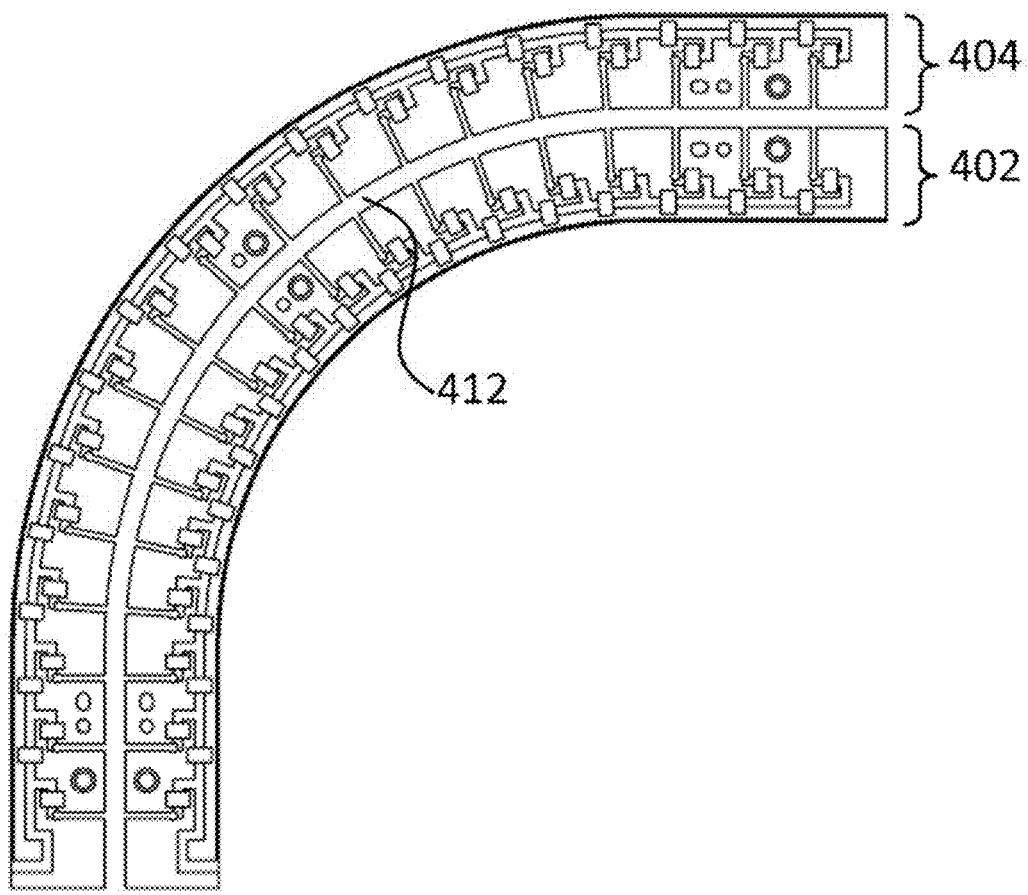
FIG. 13 is top plan view showing two un-bridged electrode structures of the curved ion guide component of FIG. 12.

FIG. 13 is top plan view of the features 402 and 404, which form two of the electrode structures of the curved ion guide component 400. Notably, there are no bridges joining the electrode structures one to the other. When the electrode structures are aligned side-by-side as shown in FIG. 13, they are separated one from the other by a gap 412.

Figure 15:
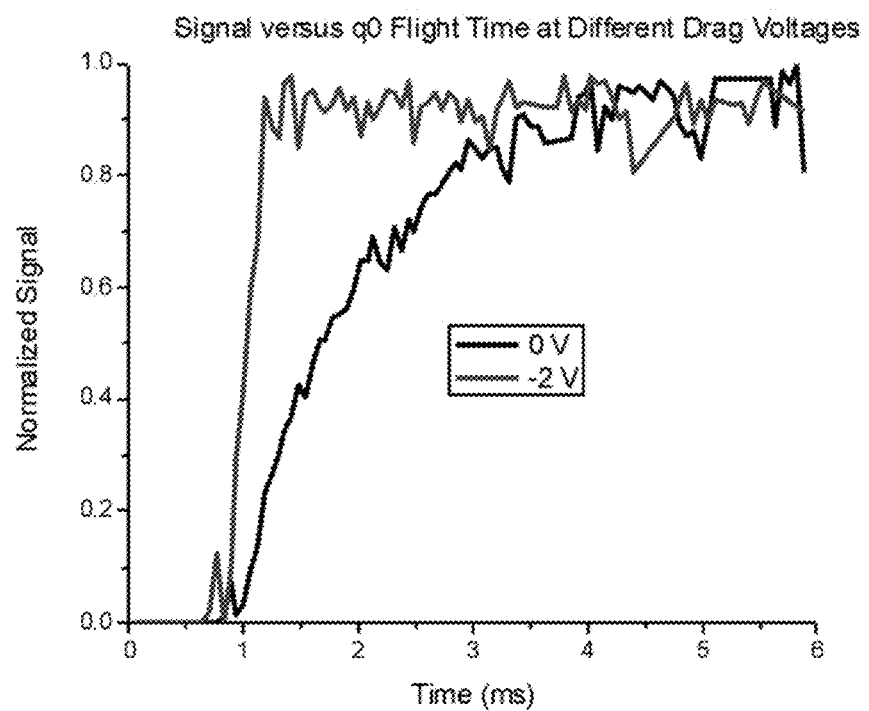
FIG. 15 shows a plot of ion signal vs. flight time at different drag voltages, measured using an ion guide according to an embodiment of the invention.

In the embodiments that are described herein, ion guide components 232 and 400 are formed having a quadrupole configuration and segmented electrode structures. As discussed supra with reference to FIG. 6F, each segment of each of the segmented electrode structures is connected to an adjacent segment by a resistor, such as for instance the resistor 224a, and by a capacitor, such as for instance the capacitor 226a. During use, the resistors set up respective voltage dividers along the lengths of the electrode structures of the ion guide components 232 or 400. The resultant voltages on the segmented electrode structures form a range of voltages, often a range of step-wise monotonic voltages. The voltages create a voltage gradient in the axial direction that urges ions along the ion path. FIG. 15 is a plot of normalized signal intensity vs. time, showing the effect of adding a −2 V drag voltage to urge the ions along the centerline of the ion guide. It is notable that a signal is detected earlier when a −2 V drag voltage is used.

In addition to machining features within the substrate 100 to define surfaces for supporting various shaped electrode bodies, optionally the machining also defines features of at least one of an ion entrance lens and an ion exit lens. For instance, each of the electrode sub-assemblies 220 and 230 that are illustrated in FIG. 6G optionally include a portion of an ion entrance lens formed adjacent to one end thereof and a portion of an ion exit lens formed adjacent to the other end thereof. Assembling together the electrode sub-assemblies 220 and 230 results in the formation of the ion guide structure with integrated ion entrance and exit lenses. Integrating the ion entrance lens and/or the ion exit lens and/or other ion optic elements with the ion guide structure further reduces the difficulty of aligning and assembling together multiple components.

While the above description constitutes a plurality of embodiments of the present invention, it will be appreciated that the present invention is susceptible to further modification and change without departing from the fair meaning of the accompanying claims.

What is claimed is:

1. An ion optics component comprising:
a first electrode sub-assembly comprising an electrically isolating material supporting a first plurality of electrode bodies defining at least two poles of a multipole ion guide structure, the first plurality of electrode bodies formed on, integrated with and in a predetermined alignment one relative to the other on the electrically isolating material of the first electrode sub-assembly;
a second electrode sub-assembly comprising an electrically isolating material supporting a second plurality of electrode bodies defining at least two other poles of the multipole ion guide structure, the second plurality of electrode bodies formed on, integrated with and in a predetermined alignment one relative to the other on the electrically isolating material of the second electrode sub-assembly; and
a mounting structure fixedly secured to the first electrode sub-assembly and to the second electrode sub-assembly, the mounting structure supporting the first plurality of electrode bodies in a predetermined alignment relative to the second plurality of electrode bodies;
at least two of the first plurality of electrode bodies having surfaces facing towards a centerline of the ion optics component that are other than parallel to first and second major surfaces of the first electrode sub-assembly, and at least two of the second plurality of electrode bodies having surfaces facing towards the centerline of the ion optics component that are other than parallel to first and second major surfaces of the second electrode sub-assembly.

2. The ion optics component according to claim 1, wherein each electrode body of the first plurality of electrode bodies is a segmented electrode body comprising a plurality of electrode body segments that are electrically isolated one from another, and wherein each electrode body of the second plurality of electrode bodies is a segmented electrode body comprising a plurality of electrode body segments that are electrically isolated one from another.

3. The ion optics component according to claim 2 comprising first surface traces provided on the electrically isolating material of the first electrode sub-assembly and second surface traces provided on the electrically isolating material of the second electrode sub-assembly, wherein the first surface traces form electrical connections to the plurality of electrode body segments of the first plurality of electrode bodies and the second surface traces form electrical connections to the plurality of electrode body segments of the second plurality of electrode bodies.

4. The ion optics component according to claim 3 comprising a plurality of resistors and a plurality of capacitors, one resistor and one capacitor disposed between adjacent electrode bodies of each of the first and second plurality of electrode bodies.

5. The ion optics component according to claim 1 wherein the first electrode sub-assembly and the second electrode sub-assembly are mirror images of one another.

6. The ion optics component according to claim 1 wherein the first electrode sub-assembly comprises a portion of at least one of an ion entrance lens and an ion exit lens, and the second electrode sub-assembly comprises a complementary portion of the at least one of an ion entrance lens and an ion exit lens.

7. The ion optics component according to claim 1 wherein the first plurality of electrode bodies and the second plurality of electrode bodies cooperate to define an ion transport volume therebetween, the ion transport volume extending along a length of the ion optics component.

8. The ion optics component according to claim 7 wherein the ion transport volume includes a portion defining a curved ion transport path.

9. An electrode assembly comprising:
an electrically isolating material having supported thereon a plurality of electrode bodies defining at least two poles of a multipole ion guide structure, the plurality of electrode bodies formed on, integrated with, and disposed in a predetermined alignment one relative to the other on the electrically isolating material, there being at least one bridge structure integrally formed in the electrically insulating material between adjacent electrode bodies of the plurality of electrode bodies and spacing the adjacent electrode bodies one from the other so as to define a space therebetween for guiding ions, at least two of the plurality of electrode bodies having surfaces configured to face towards a centerline of the multipole ion guide structure that are other than parallel to first and second major surfaces of the electrode assembly.

* * * * *